United States Patent
Minner

[11] 3,944,851
[45] Mar. 16, 1976

[54] RING COUNTER CIRCUIT WITH ELECTRONIC SWITCH CONTROL OF CLOCK PULSE TRANSMISSION

[75] Inventor: Willy Minner, Schwaigern, Germany

[73] Assignee: Licentia Patent-Verwaltungs-GmbH, Frankfurt am Main, Germany

[22] Filed: May 29, 1974

[21] Appl. No.: 474,445

[30] Foreign Application Priority Data
June 1, 1973 Germany............................. 2327952

[52] U.S. Cl. ........................... 307/223 R; 307/224 R
[51] Int. Cl.² .................... H03K 21/00; H03K 23/08; H03K 27/00
[58] Field of Search ........ 307/223 R, 223 B, 224 R; 328/43

[56] References Cited
UNITED STATES PATENTS

| | | | |
|---|---|---|---|
| 2,820,153 | 1/1958 | Woll................................ | 307/223 R |
| 2,971,101 | 2/1961 | Hurst et al. ..................... | 307/224 R |
| 3,026,426 | 3/1962 | White.............................. | 307/224 R |
| 3,309,537 | 3/1967 | Archer ............................ | 307/223 B |
| 3,469,110 | 9/1969 | Sherman ......................... | 307/223 R |

*Primary Examiner*—Stanley D. Miller, Jr.
*Attorney, Agent, or Firm*—Spencer & Kaye

[57] ABSTRACT

A ring counter composed of a plurality of stages connected in sequence and including electronic switches, holding circuits, and elements for feeding a timing pulse only to a stage connected after a stage which is switched on.

2 Claims, 4 Drawing Figures

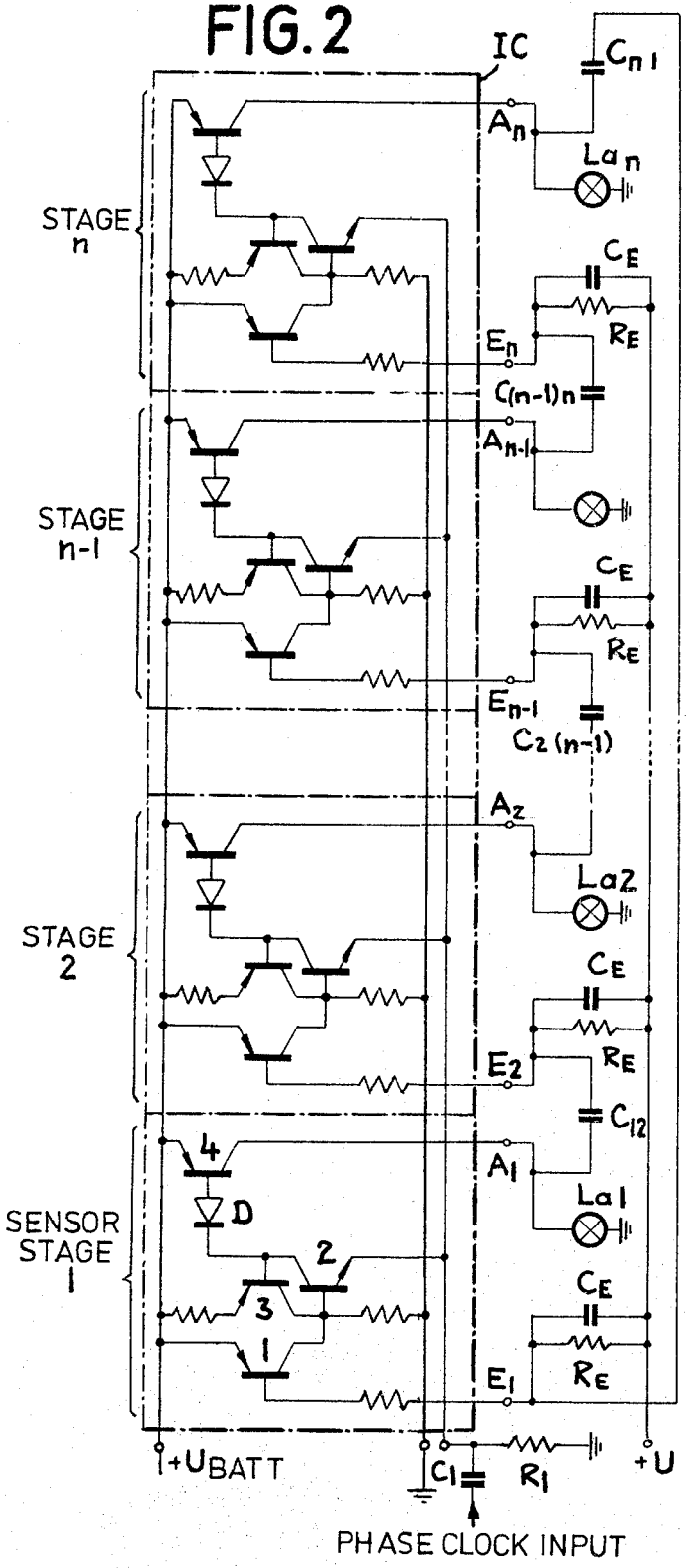
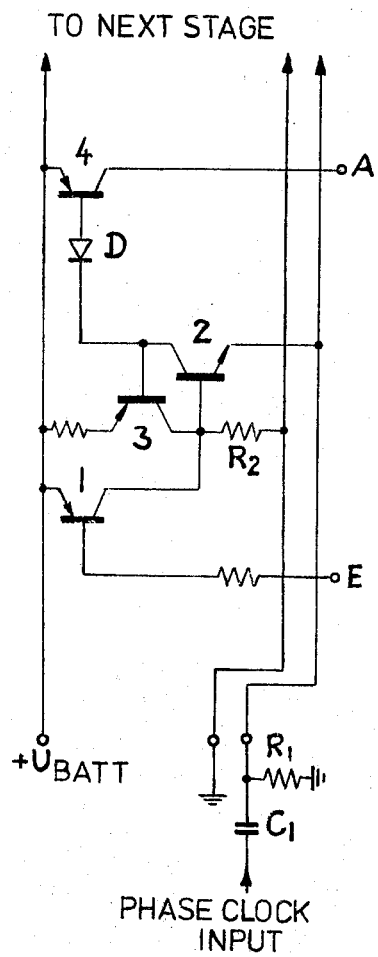

RING COUNTER CIRCUIT WITH ELECTRONIC SWITCH CONTROL OF CLOCK PULSE TRANSMISSION

BACKGROUND OF THE INVENTION

The invention relates to a ring counter comprising a plurality of stages with electronic switches and holding circuits, which are linked to sequence switches, and which switch voltages on or off in equipment, particularly television and radio equipment.

In modern radio and television technology, as is well known, so-called sensor ICs are used, which make it possible for the equipment keys to switch over or switch the equipment and which are merely touched and no longer have to be pressed. A sensor IC is an integrated circuit which is built up of a plurality of stages.

In known circuits, as will be explained later, a plurality of capacitances are required and this is a disadvantage when constructing the ring counters as integrated circuits due to their required values. Thus the capacitances may be required to have a value of 20 to 30pF and be able to block voltages of up to 30V. This high blocking voltage requires a relatively large semiconductor surface if it is to be produced by integrated circuit techniques and this can make the unit excessively unwieldy and expensive.

SUMMARY OF THE INVENTION

It is an object of the invention to provide a ring counter in which no capacitances, or at least relatively few capacitances, are required.

According to the invention, there is provided a ring counter comprising a plurality of stages in sequence and including electronic switches and holding circuits and means for feeding a timing pulse to an input of a stage of said plurality of stages only when a stage immediately preceding said stage is switched on.

Further according to the invention, there is provided a ring counter, comprising a plurality of stages with electronic switches and holding circuits, which are linked to sequence switches and switch on or off voltages in equipment, particularly television or radio equipment, characterized in that the timing pulse is fed only to the input of that stage which is connected after the switched-on stage so that the timing pulse switches on only the stage connected thereafter and switches off the stage connected therebefore.

BRIEF DESCRIPTION OF THE DRAWINGS

The invention will now be described in greater detail, by way of example, with reference to the drawings, in which:

FIG. 1 is a circuit diagram of an individual sensor stage of a known ring counter;

FIG. 2 is a circuit diagram of a part of a known integrated circuit showing sensor stages 1,2,($n$−1) and $n$;

DESCRIPTION OF THE PREFERRED EMBODIMENTS

Figure 3:
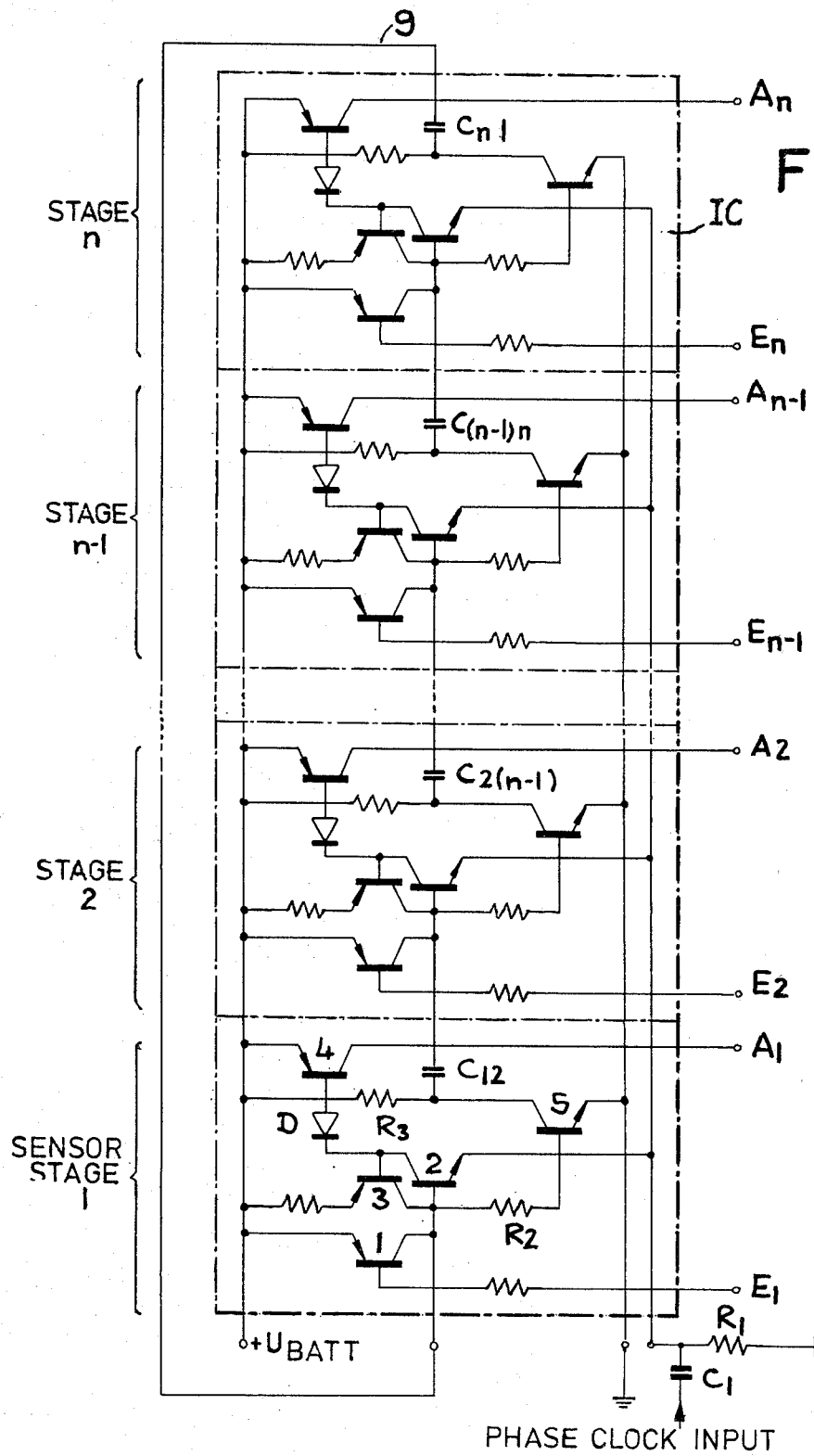
FIG. 3 is a circuit diagram similar to FIG. 2 but showing a different form of circuit.

FIG. 1 illustrates the principal mode of operation of an individual sensor stage of a known circuit. If a voltage is fed at the input E to the sensor stage shown in FIG. 1, which voltage is smaller or more negative than the battery voltage $U_{Batt}$, then the transistors 1 and 2 are made current-conducting.

In this case the collector current of the transistor 2 flows through the diode D as well as through the control path of the transistor 4, which also becomes conductive thereby. The result of this is that the output A is connected to the battery voltage $U_{Batt}$. The voltage drop occurring at the transistor 4 and the diode D switches on the transistor 3 which sends a current through the resistance $R_2$ so that the output A remains switched on, even if the negative voltage is removed at the input E. A sensor stage thus simultaneously has the function of a holding circuit.

The current through the transistor 2 flows through the resistance $R_1$ common for all the stages and produces a voltage drop which is approximately the same as the voltage across $R_2$. If a positive timing pulse, which is formed by means of $C_1$, appears at $R_1$ then the voltage at the emitter of the transistor 2 becomes greater than its base voltage and the stage switches off.

FIG. 2 shows a known integrated circuit formed as sensor IC, with the sensor stages 1, 2 . . . $n$, which are connected by externally connected components to form a ring counter. In the case of this known sensor circuit, in each case, the output of the preceding stage is connected through a capacitance to the input of the following stage. In FIG. 2, of the $n$ stages, merely the first stage, the second stage, the next to the last stage ($n$−1) and the last ($n$) stage are shown for the sake of clarity. According to FIG. 2 the output $A_1$ of the first stage is coupled by means of a capacitance $C_{12}$ to the input $E_2$ of the second stage, the output $A_2$ of the second stage by means of the capacitance $C_{2(n-1)}$ to the input $E_{(n-1)}$ of the ($n$−1)th stage, the output $A_{(n-1)}$ by means of $C_{(n-1)n}$ to the input $E_n$ of the $n$th stage and the output $A_n$ of the $n$th stage by means of $C_{n1}$ to the input $E_1$ of the first stage to form a ring counter.

As can be further seen from FIG. 2, a $R_E C_E$ combination is connected in parallel to each input E of the sensor circuit, which combination serves for the formation of the forward switching pulses. If, for example, the first stage is switched on, then there is a positive voltage at the output $A_1$ of the first stage and the lamp $La_1$ is switched on. A positive timing pulse through $C_1$ at $R_1$ switches the first stage off as already stated. The voltage at $A_1$ in this case tends towards zero. This voltage is effective through the capacitance $C_{12}$ as a negative forward switching pulse at the input $E_2$ of the second stage and switches the second stage on. A further timing pulse at $C_1 R_1$ again switches the second stage off and switches the ($n$−1)th stage on through $C_{2(n-1)}$. Each further timing pulse at $C_1 R_1$ thus switches the sensor IC of FIG. 2 on by one stage as a ring counter.

The timing pulses are thus fed by means of $C_1 R_1$ to all sensor stages in common and the switched-on stage is switched off in each case, whereby the voltage of its ouput tends towards zero. This switch-off pulse edge is formed by the coupling capacitance $C_{12}$ or $C_{2(n-1)}$, $C_{(n-1)nl}$ $C_n'$ and formed by the $R_E C_E$ combination connected parallel to the inputs and is used to switch on the stages connected thereafter.

The likewise known arrangement of FIG. 3 differs from the arrangement of FIG. 2 substantially in its greater degree of integration. As FIG. 3 shows, above all the coupling capacitances $C_{12}$, $C_{2(n-1)}$ . . . $C_{(n-1)n}$ and $C_{n1}$ are concomitantly integrated, which of course requires an additional transistor 5 per sensor stage as well as an additional resistance $R_3$, because the components of the ring counter are formed in the ICs. The arrangement of FIG. 3 has, as compared with the arrangement of FIG. 2, the advantage that the inputs and outputs of the sensor ICs are free from sequential pulses, because of the fact that the coupling capacitances are included in the integrated circuit and thus are deeply in the circuit. In this way the capacitances of the outer lines such as connecting lines to the sensor contacts, to the potentiometers or program indicator lamps have no influence on the operation of the ring counter.

The known solutions have the disadvantage that they require an integration of capacitances per stage, which must have a capacitance of 20 to 30 pF and blocking voltages of up to 30 V. Above all, this high blocking voltage requirement requires a relatively large semiconductor surface in the case of an integration.

One embodiment of the invention will now be described with reference to FIG. 4:

In the case of the ring counter according to the invention (FIG. 4) there is provided in the individual stages as compared to the known solutions instead of the diode D, a transistor 6, the collector of which is connected to a further transistor 7. The collector of the transistor 7 is connected to the base of the transistor 2 of the stage connected thereafter. The bases of the transistors 7 of all the stages of the ring counter are connected together and are led out of the integrated circuit. The resulting common connection 8 for the bases of all the transistors 7 forms the new input for the timing pulse. The timing pulse is fed to the input 8 through the capacitance $C_1$. A resistance $R_4$ is connected between the timing input 8 and the connection for the positive pole of the battery ($U_{Batt}$).

Figure 4:
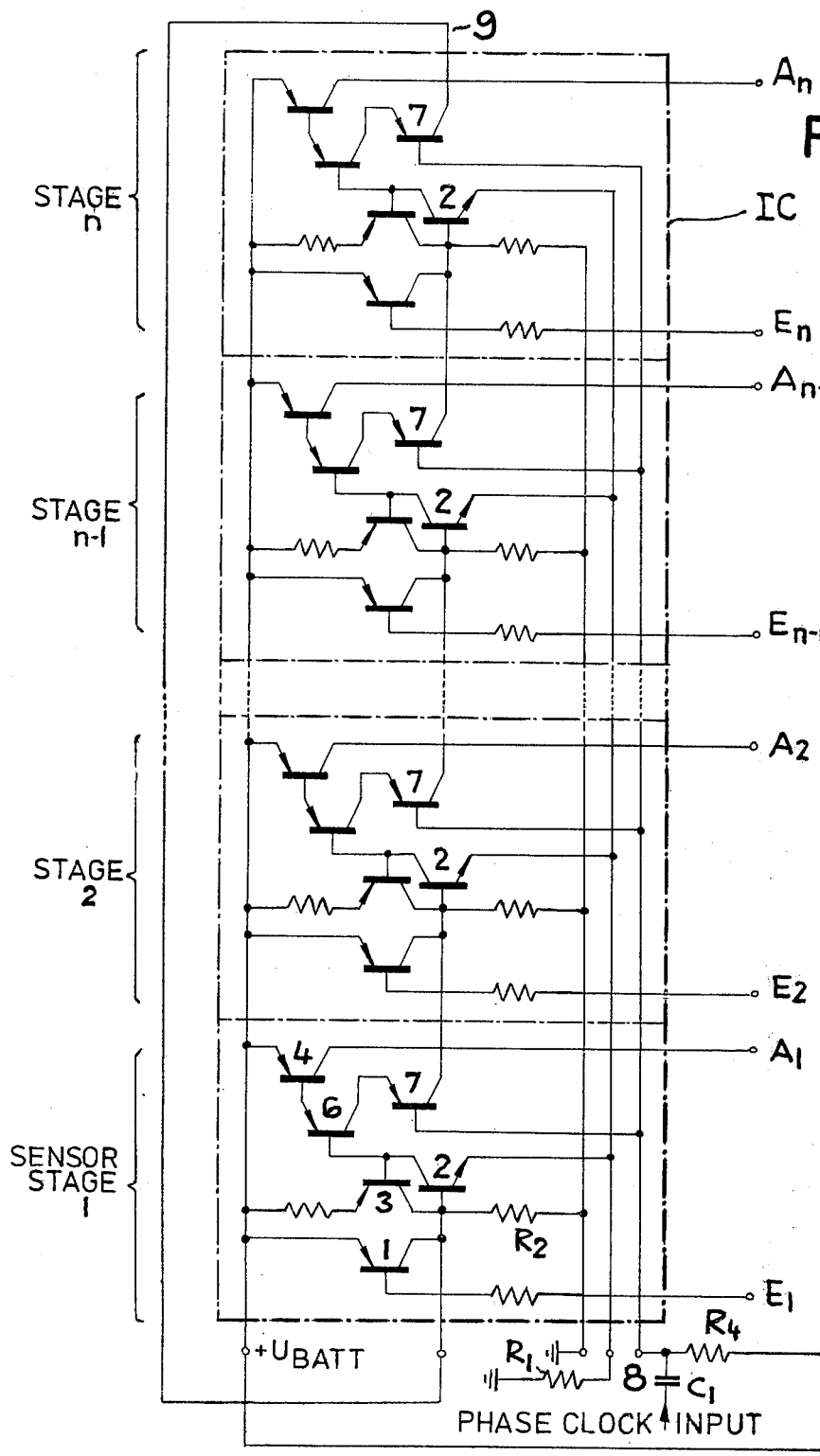
FIG. 4 is a circuit diagram similar to FIG. 2 but showing a form of circuit according to the invention.

The mode of operation of the ring counter of FIG. 4 is as follows:

If, for example, the sensor stage 1 is switched on, then the transistor 4, as already stated, conducts current through the base-emitter path of the transistor 6. The transistor 6 is thus switched on and its collector has a positive potential. The base of the transistor 7 is, like the bases of all the other transistors 7, connected to the outer resistance $R_4$ and thus to the positive pole ($+U_{Batt}$) and the transistors 7 are blocked. If a negative timing pulse is applied to $C_1$ then the bases of the transistors 7 are likewise negative. However only the transistor 7 of stage 1 can pass on a positive potential by means of its collector to the stage 2 and thus switch on the second sensor stage because a positive potential is applied only at its emitter, whereas the emitters of the transistors 7 of the further stages do not conduct a positive potential. Each further timing pulse switches the next following stage on like a ring counter. The electrical connection of the collector of the transistor 7 of the nth stage to the base of the transistor 2 of the first stage closes the ring. The timing pulses inverted by means of the transistor 7 are thus fed only to those sensor stages which have to be switched on according to the forwarding mechanism of a ring counter. This sensor stage is always the sensor stage next adjacent to the switched on stage in each case as seen in the counting direction.

The circuit of FIG. 4 has all the advantages of the known arrangement of FIG. 3, i.e. integration of as many elements as possible of the ring counter and keeping clear the inputs and outputs of sequential pulses, but has in addition, as compared to the known arrangement of FIG. 3, the further advantage that capacitances can be dispensed with so that no integration of capacitances is necessary.

It will be understood that the above description of the present invention is susceptible to various modifications, changes and adaptations.

What is claimed is:

1. In a ring counter composed of a plurality of stages each including a holding circuit and an electronic switch, said stages being connected to one another in succession to form sequence switches to switch voltages on and off in electronic equipment, with each stage being switchable between a first and a second state and with one stage being in the first state and the remaining stages being in the second state at any given moment, and means connected for supplying to the stages a succession of clock pulses in such a manner that each clock pulse switches the one stage from the first state to the second state and switches the immediately succeeding stage from the second state to the first state, the improvement wherein said means comprise;

in each said stage, a first transistor connected in said stage to be in a switching state determined by the state of its respective stage and a second transistor connected between said first transistor and the next-succeeding stage and having a control input connected to receive the clock pulses, said second transistor being connected to supply, upon the occurrence of a clock pulse, a signal which switches the next-succeeding stage to its first state only when said first transistor is in its switching state corresponding to the first state of said stage, whereby each clock pulse acts on the input of only the stage succeeding that stage which was in its first state prior to such pulse to place such next-succeeding stage in its first state, and further acts to swtich the stage which was previously in its first state into its second state.

2. A ring counter as defined in claim 1 wherein, in each said stage, said second transistor has its emitter-collector path connected between said first transistor and an input of the next-succeeding stage, and has its base connected to receive the succession of clock pulses.

* * * * *